(12) United States Patent
Ozawa

(10) Patent No.: US 9,379,612 B2
(45) Date of Patent: Jun. 28, 2016

(54) OUTPUT CURRENT MONITOR CIRCUIT FOR SWITCHING REGULATOR

(71) Applicant: Dialog Semiconductor (UK) Limited, Reading (GB)

(72) Inventor: Seiichi Ozawa, Wakoh (JP)

(73) Assignee: Dialog Semiconductor (UK) Limited, Reading (GB)

( * ) Notice: Subject to any disclaimer, the term of this patent is extended or adjusted under 35 U.S.C. 154(b) by 0 days.

(21) Appl. No.: 14/550,921

(22) Filed: Nov. 22, 2014

(65) Prior Publication Data
US 2016/0141957 A1   May 19, 2016

(30) Foreign Application Priority Data

Nov. 19, 2014 (EP) .................................. 14193955

(51) Int. Cl.
 *H02M 3/158*  (2006.01)
 *H02M 3/156*  (2006.01)
 *H02M 1/00*  (2006.01)
(52) U.S. Cl.
 CPC ...................................... *H02M 3/158* (2013.01)
(58) Field of Classification Search
 CPC ... H02M 3/1588; H02M 3/156; H02M 3/158; H02M 3/1582
 USPC .................................. 323/282, 285, 283, 286
 See application file for complete search history.

(56) References Cited

U.S. PATENT DOCUMENTS

| | | | |
|---|---|---|---|
| 5,955,871 A | 9/1999 | Nguyen | |
| 6,166,528 A * | 12/2000 | Rossetti | H02M 3/1588 323/283 |
| 7,045,993 B1 * | 5/2006 | Tomiyoshi | H02M 3/1588 323/224 |
| 7,372,238 B1 | 5/2008 | Tomiyoshi | |
| 7,372,241 B1 * | 5/2008 | Tomiyoshi | H02M 3/1588 323/224 |

(Continued)

FOREIGN PATENT DOCUMENTS

| | | |
|---|---|---|
| WO | WO 9931790 | 6/1999 |
| WO | WO 2007/080163 | 7/2007 |

OTHER PUBLICATIONS

Co-pending U.S. Pat. No. DS13-096, U.S. Appl. No. 14/795,147, filed Jul. 9, 2015, "Output Current Monitor Circuit for Switching Regulator," by Seiichi Ozawa, 25 pgs.

(Continued)

*Primary Examiner* — Adolf Berhane
*Assistant Examiner* — Sisay G Tiku
(74) *Attorney, Agent, or Firm* — Saile Ackerman LLC; Stephen B. Ackerman

(57) ABSTRACT

A circuit and method for providing switching regulation with an improved current monitor comprising a pulse width modulation (PWM) controller configured to provide an output signal voltage, an output stage configured to provide switching comprising a first and second transistor, and first inverter, a sense circuit configured to provide signal sensing from said output stage, a sampling switch circuit configured to provide sample signals from said sense circuit, a differential integrator circuit configured to provide sample signals from said sampling switch circuit, a comparator configured to provide signals from said integrator circuit, a control logic circuit configured to provide signals from said comparator, a current digital-to-analog converter (DAC) configured to provide feedback signal from said control logic circuit, and, a digital filter configured to provide output current information.

22 Claims, 7 Drawing Sheets

(56) References Cited

U.S. PATENT DOCUMENTS

| | | | |
|---|---|---|---|
| 7,936,160 B1* | 5/2011 | Sheehan | H02M 3/156 323/222 |
| 8,508,203 B2 | 8/2013 | Tang et al. | |
| 2010/0033146 A1 | 2/2010 | Irissou et al. | |
| 2014/0002037 A1* | 1/2014 | Babazadeh | H02M 3/156 323/271 |
| 2014/0097814 A1* | 4/2014 | Brewster | H02M 3/156 323/282 |

OTHER PUBLICATIONS

European Search Report 14193955.3-1809, Jun. 10, 2015, Dialog Semiconductor (UK) Ltd.

* cited by examiner

OUTPUT CURRENT MONITOR CIRCUIT FOR SWITCHING REGULATOR

RELATED PATENT APPLICATION

This application is related to Ser. No. 14/795,147, filed on Jul. 9, 2015, which is assigned to a common assignee, and which is herein incorporated by reference in its entirety.

BACKGROUND

1. Field

The disclosure relates generally to a voltage regulator and, more particularly, to output power management thereof.

2. Description of the Related Art

Voltage regulation is important where circuits are sensitive to transients, noise and other types of disturbances. The control of the regulated voltage over variations in both semiconductor process variation, and temperature is key to many applications. Additionally, power consumption is also a key design requirement.

In recent PMIC, precise output monitoring of buck is required for more efficient power management of processors. Sensed and digitized average output current information is used for controlling processors.

FIG. 1 shows the circuit schematic in a block diagram form of the prior art. The buck circuit 100 comprises a pulse width modulation (PWM) control unit 105, an output stage 130, a current sensing network 120, a buffer 140, and an analog-digital converter (ADC) 150. The output stage 130 comprises a p-channel MOS (PMOS) pull-up 135, and n-channel MOS (NMOS) pull-down 145. The sensing network is shown for the case of the NMOS 145 sense.

The current sense network 120 has a pull-up Sense NMOS 160, and pull-down Sense NMOS 165 whose signal is inverted by inverter 162. The output signal is connected to a Sampling switch SW 170 which receives a switch signal from the PWM controller 105. The Sampling switch SW is connected to an RC filter comprising resistor R 172 and capacitor C 175. A comparator 180 receives a signal to its negative input, an produces a negative polarity denoted as −Isense signal 182 which is a feedback loop to the input of the Sampling switch SW 170 and Isense signal, 184.

The output stage 130 has a center node LX 136 which is connected to the LC filter formed from inductor 152 and capacitor 153, for the output node voltage vout 155.

The output current causes the voltage drop over NMOS 145 during NMOS is turned on. The current sense amp converts the voltage drop into the sense current Isense. Isense is translated into voltage with Riv and digitized by ADC. Thus the digitized and averaged output current information is obtained.

As discussed, the Current sense amp 120 is comprised of sense NMOS 160, sampling switch 170, RC low pass filter (LPF) comprising resistor R 172 and capacitor C 175 and output trans-conductance amplifier OTA 180.

FIG. 2 is a timing diagram of the current sense amplifier 200 for the prior art embodiment shown in FIG. 1. The timing diagram 200 illustrates the Inductor current ILX 210, voltage v(LX) 220, and sample voltage Vsample_in 230, and OTA voltage Vota_inn 240. The sensed voltage Vsense during NMOS 160 on-time is expressed using the NMOS 145 on-resistance Rnon and the sense NMOS's 160 on-resistance Rsense:

$$Vsense = -Rnon*ILX + Rsense*Isense$$

Vsense is sampled during the NMOS 145 on time and held during the off time, and inputted to the OTA through RC low pass filter (LPF). The OTA controls Isense so that average of Vinn is equal to zero or ground level. If average of Vinn is equal to average of Vsense, average of Isense is proportional to average of ILX.

$$\text{Average}(Isense) = (Rnon/Rsense)*\text{average}(ILX)$$

But in reality, Vsense swings with ripple of the output current during the NMOS is turned on. As a result, the voltage Vinn held by the Sampling switch SW 170 at the end of the NMOS on time is shifted from average of Vsense and it causes error of the output current monitor.

U.S. Pat. No. 8,508,203 to Tang et al., describes a control logic circuit, for receiving a pulse width modulation (PWM) signal and a confirmation signal, and generating a setting signal, a resetting signal, and a lower gate control signal; a level shift circuit, coupled to the control logic circuit, for converting the setting signal and the resetting signal.

U.S. Pat. No. 5,955,871 to Nguyen, describes a switching regulator for use with a computer system having a power conservation mode includes a switch circuit, a sampling storage device, a sampling circuit and a controller.

U. S. Patent Application 20100033146 to Irissou et al., describes a method for providing output (e.g., current) sensing and feedback in switching power converter topologies. Some embodiments include feedback functionality for generating a converter driver signal (for driving the switching converter) and/or a sample driver signal (for driving the sampling module) as a function of sensed output feedback from the sampling module WO 1999031790 to Clark et al., describes a regulator with a sampling circuit that makes measurements of an electrical characteristic of the voltage regulator at discrete moments of time. A feedback circuit is coupled to the sampling circuit and the switch, and is configured to use the measurements to control the duty cycle to maintain the DC voltage substantially constant.

In these prior art embodiments, the solution to establish sensing schemes for improved operation utilized various alternative solutions.

SUMMARY

It is desirable to provide a solution to address an efficient voltage regulator with minimal power consumption.

It is desirable to provide a solution that utilizes a pulse width modulation (PWM) controller.

It is desirable to provide a sampling solution that utilizes an output stage comprising switching devices.

It is desirable to provide a sampling solution that utilizes sampling switches.

It is desirable to provide a sampling solution that utilizes sensing devices of which resistance are proportional to one of the switching devices.

It is desirable to provide a sampling solution that utilizes an integrator.

It is desirable to provide a sampling solution that utilizes a feedback circuit which feedbacks current signal to sense devices, which is dependent on the integrator.

A principal object of the present disclosure is to provide a circuit whose current monitor error is due to the error of the average of the sample-and-hold sense voltage.

A principal object of the present disclosure is to provide a circuit whose average output current information is digitized.

Another further principal object of the present disclosure is to provide a circuit whose average output current information is digitized with less hardware than prior art.

In summary, a circuit for providing switching regulation with an improved current monitor comprising a pulse width modulation (PWM) controller configured to provide an output signal voltage, an output stage configured to provide switching comprising a first and second transistor, and first inverter, a sense circuit configured to provide signal sensing from the output stage, a sampling switch circuit configured to provide sample signals from the sense circuit, a differential integrator circuit configured to provide sample signals from the sampling switch circuit, a comparator configured to provide signals from the integrator circuit, a control logic circuit configured to provide signals from the comparator, a current digital-to-analog converter (DAC) configured to provide feedback signal from the control logic circuit, an inductor, and, a digital filter configured to provide output current information.

In addition, a method is disclosed in accordance with the embodiment of the disclosure. A method of providing an improved current monitor in a switching regulator comprising the steps of, a first step (a) providing a circuit comprising a PWM controller, an output stage, a sense circuit, a sampling switch circuit, a differential integrator, a comparator, a control logic circuit, a digital filter, a current DAC, and a feedback loop, a second step (b) generating a signal from the PWM controller to the output stage, a third step (c d) initiating a NMOS signal ndry to said NMOS of said output stage, a fourth step (d) sensing a signal to a sense NMOS circuit providing a first and second sense signals, a fifth step (e) receiving a first and second sense signal to said sampling switch circuit, a sixth step (f) integrating said first and said second sense signal to said differential integration circuit, a seventh step (g) comparing said first and said second integrated signal with said comparator, an eighth step (h) processing said comparator signal with said control logic, a ninth step (i) filtering the output signal with a digital filter, a tenth step (j) feeding a feedback signal from said control logic to said current DAC; and an eleventh step (k) estimating the average output current.

Other advantages will be recognized by those of ordinary skill in the art.

BRIEF DESCRIPTION OF THE DRAWINGS

The present disclosure and the corresponding advantages and features provided thereby will be best understood and appreciated upon review of the following detailed description of the disclosure, taken in conjunction with the following drawings, where like numerals represent like elements, in which.

DETAILED DESCRIPTION

Figure 1:
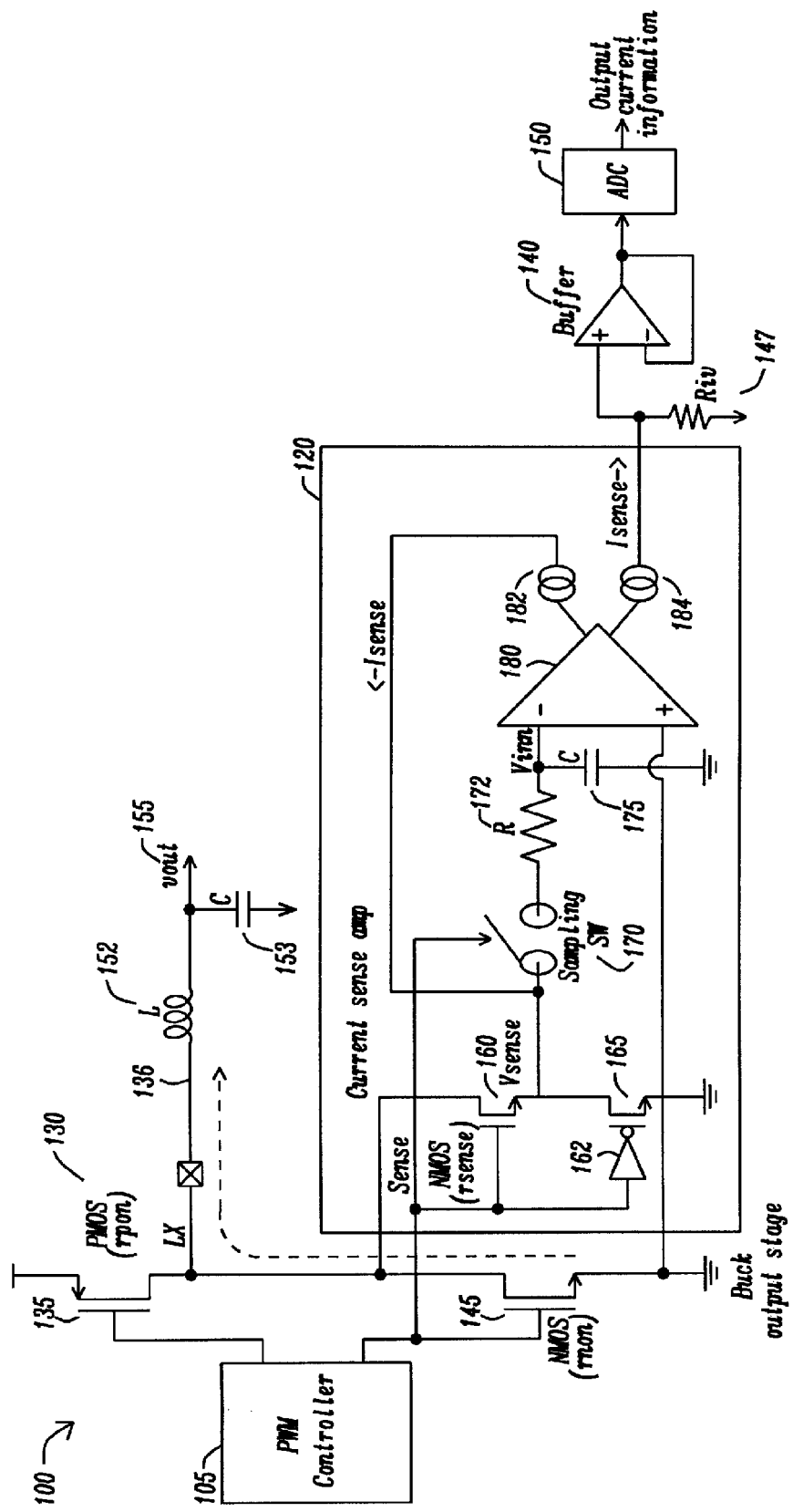
FIG. 1 is a circuit schematic of a prior art of a switching regulator.
Figure 2:
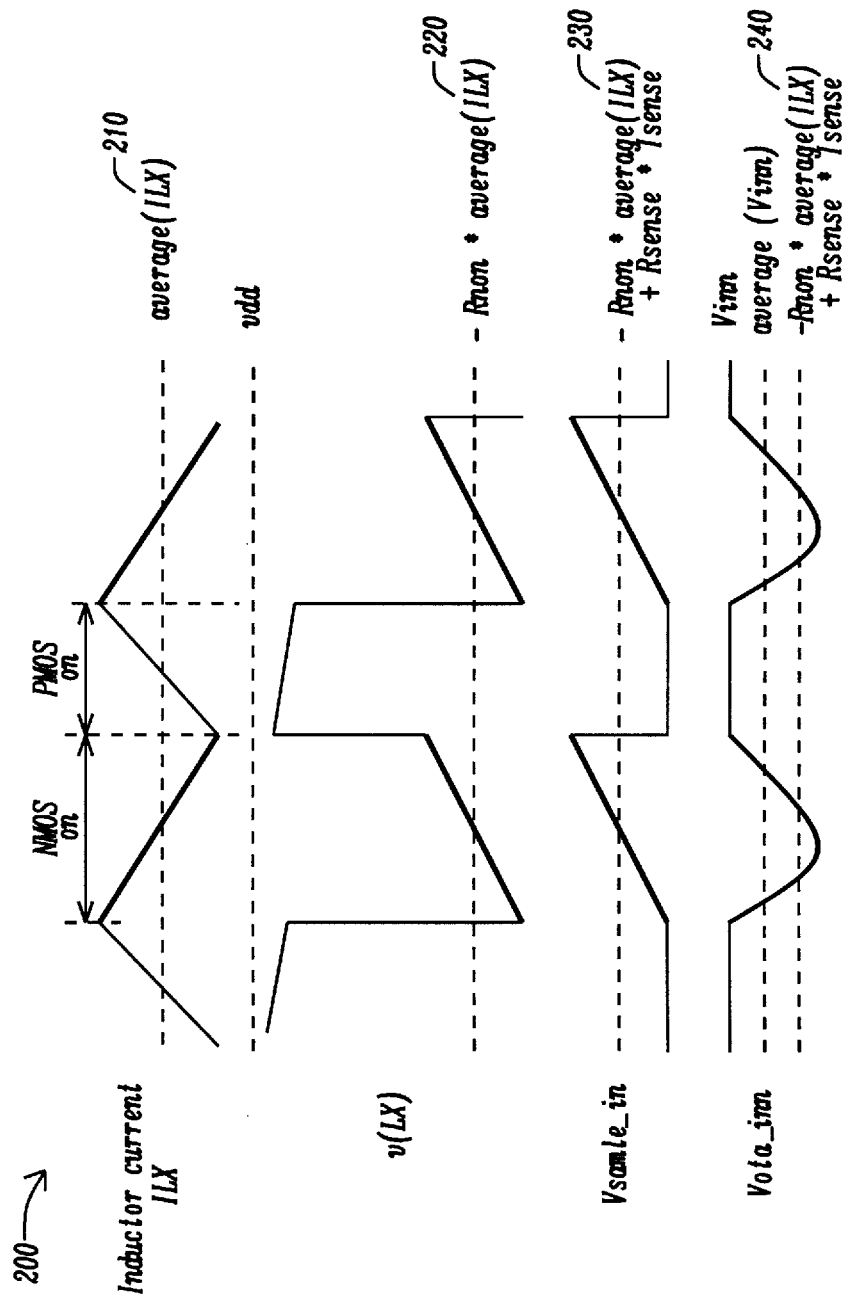
FIG. 2 is a timing diagram of a prior art of a switching regulator.
Figure 3:
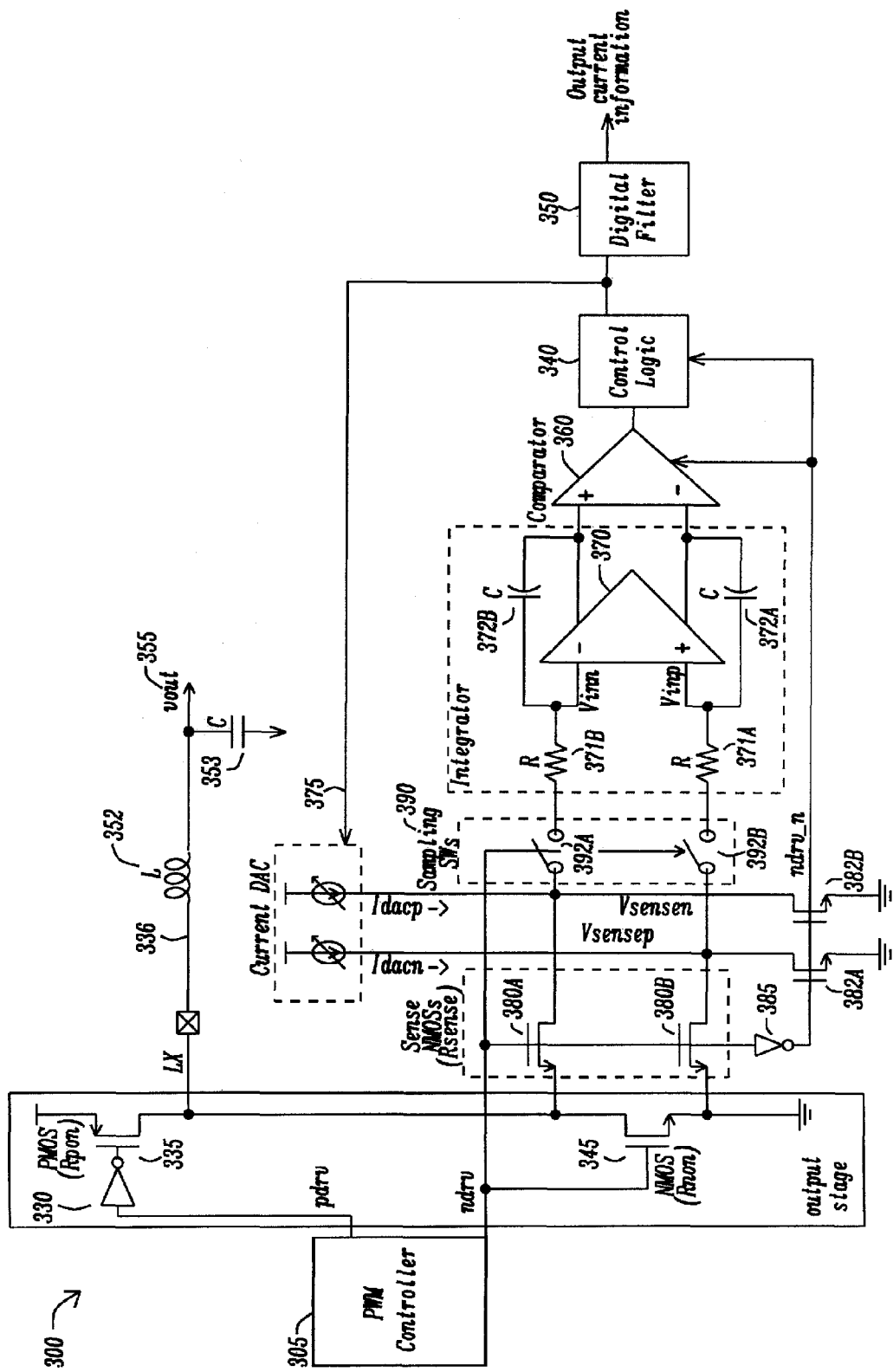
FIG. 3 is a circuit schematic in accordance with the first embodiment of the disclosure.

FIG. 3 is a circuit schematic in accordance with the first embodiment of the disclosure. FIG. 3 shows a block diagram of the preferred embodiment. It handles signals in differential manner for good accuracy and noise immunity, but single end implementation is still possible to reduce amount of hardware. The circuit estimates the average output current from voltage drop across the NMOS.

FIG. 3 shows the circuit schematic in accordance with the first embodiment of the disclosure. The buck circuit 300 comprises a pulse width modulation (PWM) control unit 305, an output stage 330, a current logic function 340, a digital filter 350, a comparator 360, a Current DAC 375, and integrator 370, a sense NMOS 380A and 380B, and a Sampling Switch 390.

The output stage 330 comprises a p-channel MOS (PMOS) pull-up 335, and n-channel MOS (NMOS) pull-down 345. The Sense NMOSs sensing network comprises NMOS 380A and NMOS 380B is sensing drain and source of NMOS 345 and whose gate is connected to signal ndrv. The signal ndry is connected to inverter 385. This inverted signal is connected to NMOS transistors 382A and 382B. The Sense NMOS network is connected to Sampling switches SWs 390 transfers the signal to the inputs to an Integrator circuit with amplifier 370 with RC integration elements with resistor 371A and resistor 371B and capacitors C 372A and C 372B whose output is connected to comparator 360. The output of the comparator 360 is connected to Control logic 340, and Digital Filter 350 to provide Output current information. The comparator 360 can be a latched comparator, or a non-latched comparator.

Figure 4:
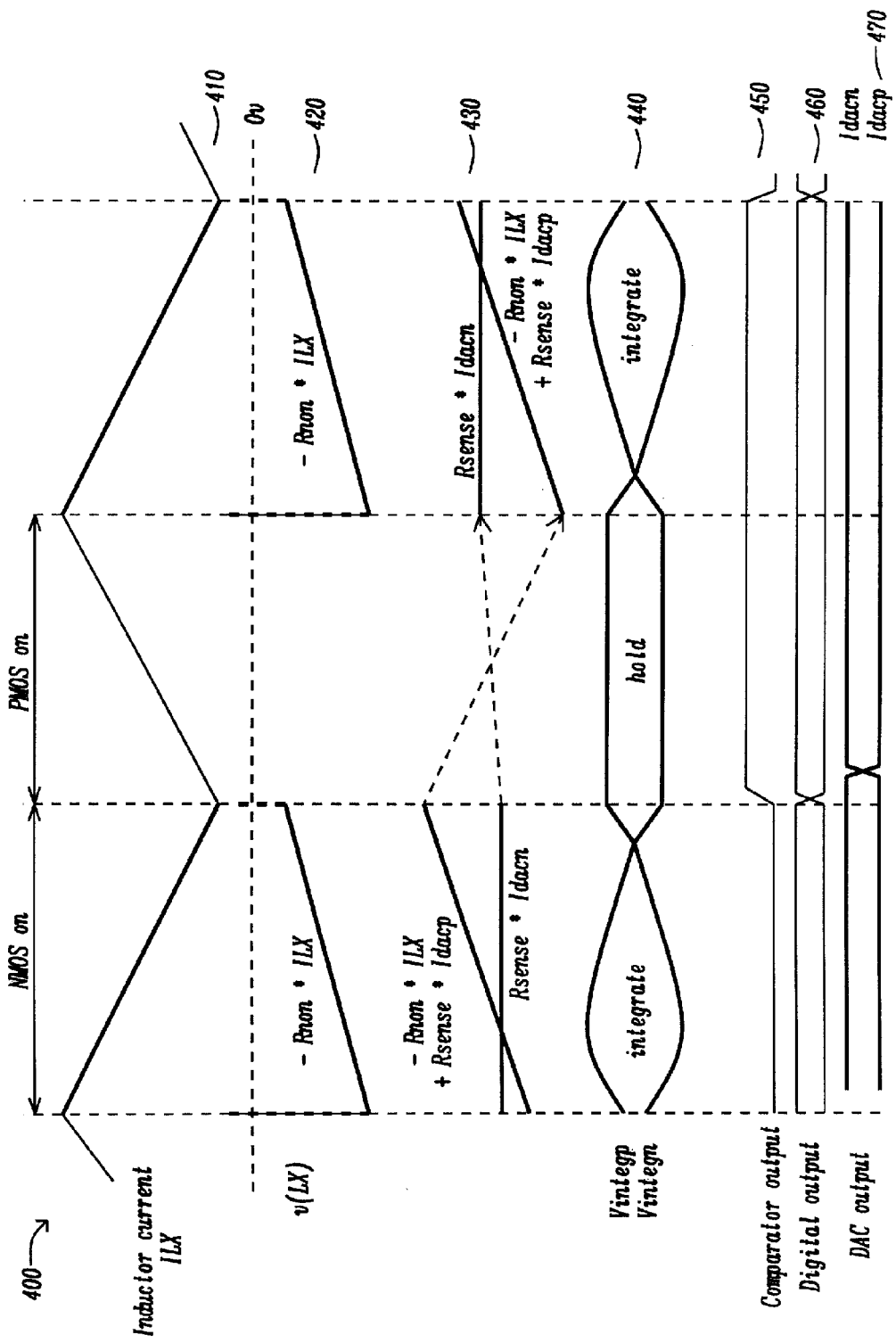
FIG. 4 is a timing diagram in accordance with the first embodiment of the disclosure.

FIG. 4 is a timing diagram in accordance with the first embodiment of the disclosure. FIG. 4 is a timing diagram of the current sense amplifier 400 for the first embodiment shown in FIG. 3. The timing diagram 400 illustrates the Inductor current ILX 410, voltage v(LX) 420, voltage on sense p and sense n, Vsensep and Vsensen 430 respectively, voltage on integrator p and integrator n, Vintegp and Vintegn 440 respectively, comparator output 450, digital output 460, and digital-to-analog converter (DAC) output 470. The voltage drop across the NMOS, v(LX) 420 is sampled by the sense NMOSs only during the NMOS is turned on. The IDAC outputs Idacp and Idacn are injected Vsensep and Vsensen 430. As a result, Rsense*Idacp and Rsense*Idacn added to the sampled voltages. The integrator integrates the differential voltage (Vsensep-Vsensen) only during the sampling switches are closed. The circuit sensed voltages of the sense circuit are Vsensen(t)=−Rnon*ILX+Rsense*Idacp and Vsensep(t)=Rsense*Idacn.

The comparator, whose output 450, judges the differential integrator output when integration is finished. The comparator can be a latched or non-latched comparator. The control logic increases or decreases the IDAC control signal according the comparator output 450. The integrator, comparator, control logic and IDAC make feedback loop. As a result, the integrator's differential output approaches zero. The IDAC's differential outputs is proportional to IDAC control signal. The digital filter filters the IDAC control signal and outputs as output current information.

Figure 5:
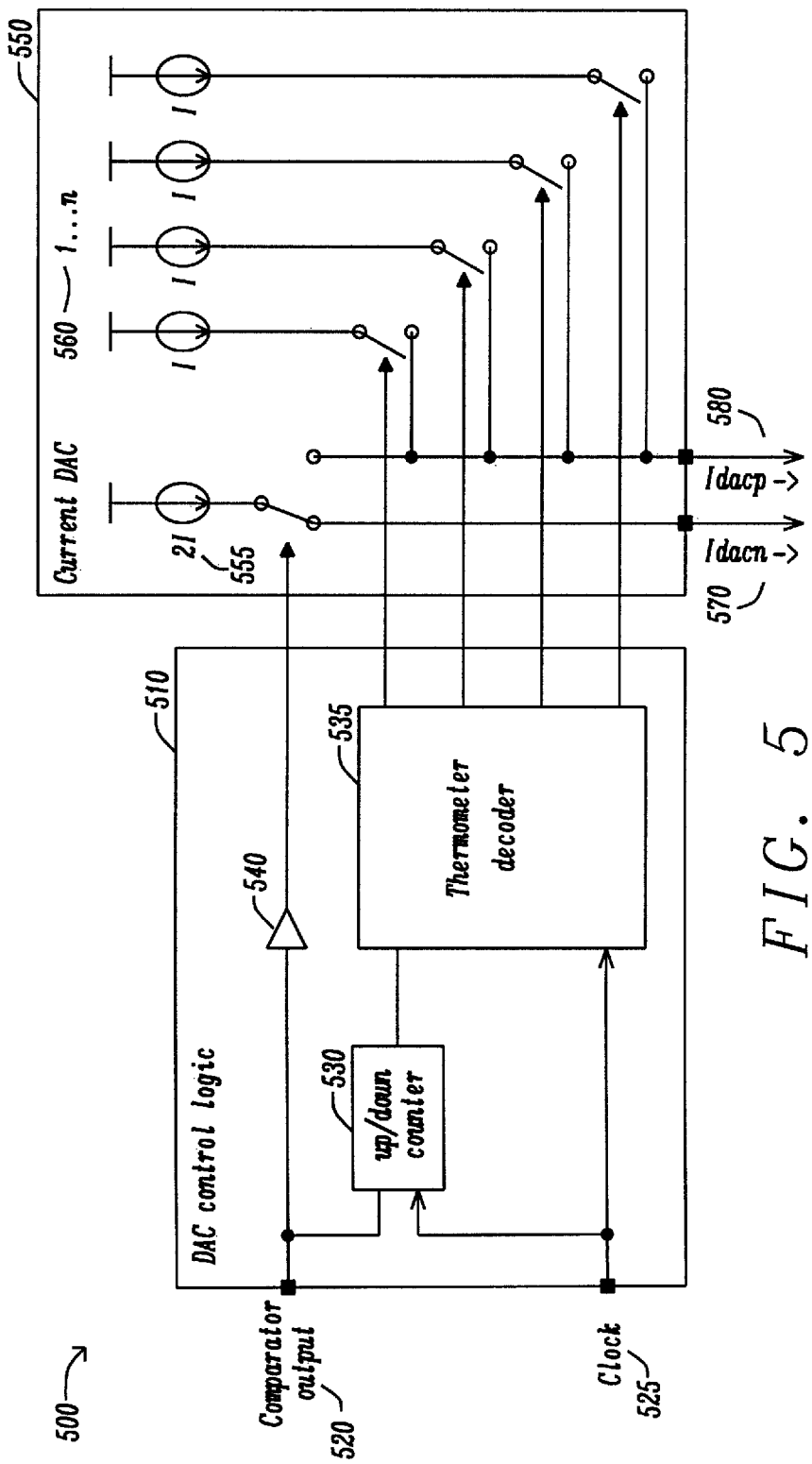
FIG. 5 is a circuit schematic of a current DAC and its control logic.

FIG. 5 shows one of embodiments of IDAC and control logic 500. FIG. 5 is a circuit schematic of a current DAC and its control logic 500. The DAC control logic 510 block comprises two input signals, comparator output 520 and Clock 525, a up/down counter 530, Thermometer decoder 535 and inverter 540. The Current DAC has current source of magnitude 2I and switch 555, and n current sources of magnitude I and switch matrix 560 1 . . . n. The output current from Idacp 580 is increased if the comparator output is high. Otherwise, the output current from Idacp 580 is decreased or Idacn 570 is increased. The circuit where the differential integrator output is Vintegp(t)−Vintegn(t)={1/RC} *Integral {Vsensep−Vsensen} ={1/RC}*Integral{Rnon*ILX−Rsense*(Idacp−Idacn)}.

Figure 6:
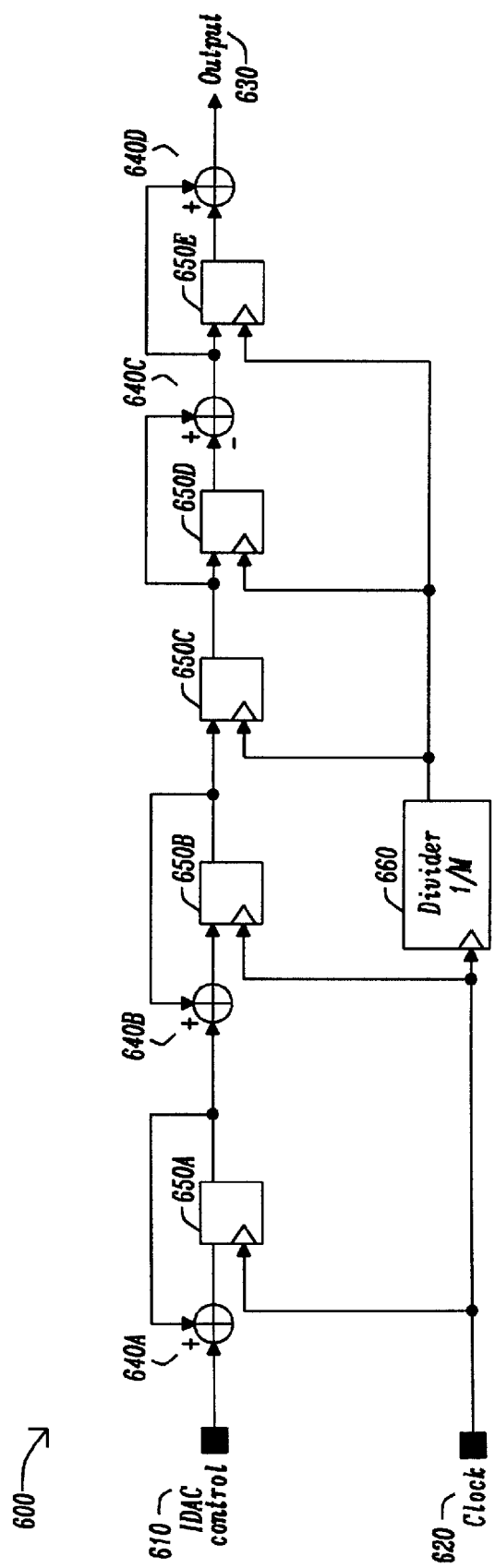
FIG. 6 is a circuit schematic of a digital filter.

FIG. 6 is a circuit schematic of a digital filter 600. The circuit 600 has two input signals, IDAC control 610, Clock 620, and an Output signal 630. It accumulates the output of the DAC control logic and filters. The circuit 600 comprises summing function 640 A, 640B, 640C, and 640D, counters 650A, 650B, 650C, and 650D, as well as Divider 1/M 660. It composes sinc$^2$ filter which is usually used for 1$^{st}$ order delta sigma modulator. It outputs the average of the IDAC control signal during M cycle time.

Other equivalent circuit embodiments can be utilized. Embodiments utilizing sense the PMOS of the output stage instead of the NMOS can have equivalent embodiments. Additionally, alternate control logic, and alternate digital filters can provide equivalency.

Figure 7:
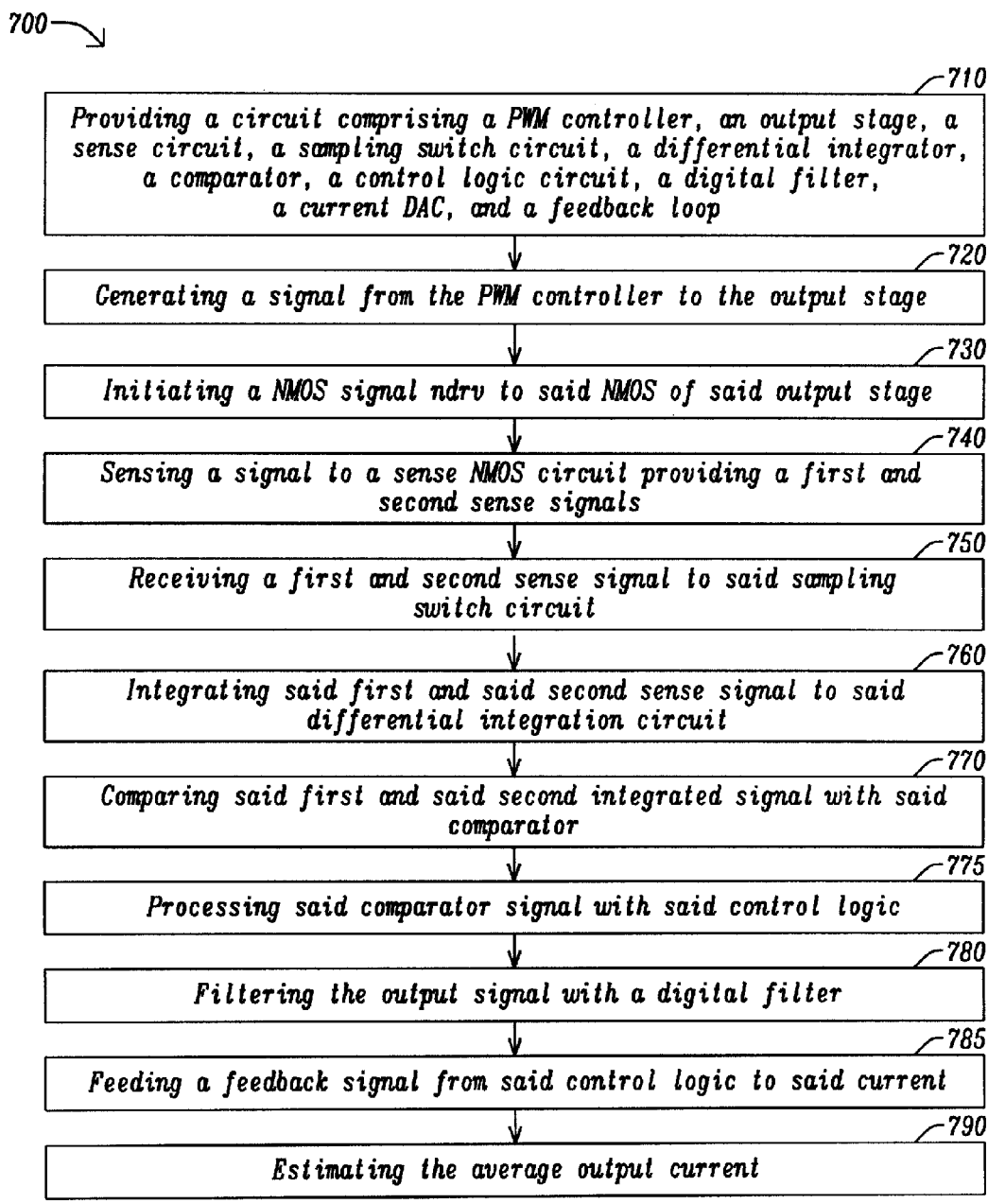
FIG. 7 is a method in accordance with the embodiment of the disclosure.

FIG. 7 is a method in accordance with the embodiment of the disclosure. A method 700 of providing an improved current monitor in a switching regulator comprising the steps of, a first step 710 (a) providing a circuit comprising a PWM controller, an output stage, a sense circuit, a sampling switch circuit, a differential integrator, a comparator, a control logic circuit, a digital filter, a current DAC, and a feedback loop, a second step 720 (b) generating a signal from the PWM controller to the output stage, a third step 730 (c) initiating a PMOS signal pdry to said PMOS of said output stage, a fourth step 740 (d) initiating a NMOS signal ndry to said NMOS of said output stage, a fifth step 750 (d) sensing a signal to a sense NMOS circuit providing a first and second sense signals, a sixth step 760 (e) receiving a first and second sense signal to said sampling switch circuit, a seventh step 770 (f) integrating said first and said second sense signal to said differential integration circuit, an eighth step 780 (g) comparing said first and said second integrated signal with said comparator, a ninth step 790 (h) processing said comparator signal with said control logic, a tenth step 785 (i) filtering the output signal with a digital filter, an eleventh step 790 (j) feeding a feedback signal from said control logic to said current DAC; and twelfth step 795 (k) estimating the average output current.

It should be noted that the description and drawings merely illustrate the principles of the proposed methods and systems. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Other advantages will be recognized by those of ordinary skill in the art. The above detailed description of the disclosure, and the examples described therein, has been presented for the purposes of illustration and description. While the principles of the disclosure have been described above in connection with a specific device, it is to be clearly understood that this description is made only by way of example and not as a limitation on the scope of the disclosure.

What is claimed is:

1. A circuit providing switching regulation with an improved current monitor comprising:
    an output stage configured to provide switching comprising a first and second transistor;
    a sense circuit configured to provide signal sensing from the first transistor in said output stage;
    a sampling switch circuit configured to provide sample signals from said sense circuit, wherein the sampling switch circuit is configured to provide a first and second signal to said integrator;
    an integrator circuit configured to provide sample signals from said sampling switch circuit;
    a comparator configured to provide signals from said integrator circuit; and
    a digital-to-analog converter (DAC) configured to provide feedback signal from said comparator.

2. The circuit of claim 1, further comprising:
    a pulse width modulation (PWM) controller configured to provide an output signal voltage;
    a control logic circuit configured to provide signals from said comparator;
    a digital filter configured to provide output current information; and
    an inductor coupled to said output stage.

3. The circuit of claim 2, wherein said sense circuit comprises n-channel metal oxide semiconductor (NMOS) transistors electrically coupled to the source and drain of said second transistor.

4. The circuit of claim 2, wherein said sense circuit is configured to provide a first and second signal to said sampling switch circuit.

5. The circuit of claim 2, wherein said digital-to-analog circuit (DAC) is configured to provide a first and second feedback signal to said first and second switch of said sampling switch circuit.

6. The circuit of claim 2, further comprising a feedback loop, a second inverter, and a first and second NMOS feedback network.

7. The circuit of claim 6, configured to provide a feedback signal to said feedback loop, from said sense circuit coupled to said second inverter, coupled to a second NMOS feedback network, and coupled to said comparator, and said control logic.

8. The circuit of claim 2 wherein said control logic circuit further comprises an up/down counter electrically coupled to the comparator output and clock signals, and a DAC control logic inverter coupled to said comparator output.

9. The circuit of claim 8, wherein said digital-to-analog converter (DAC) is coupled to said DAC control logic inverter and is configured to provide an ldacn signal.

10. The circuit of claim 8, wherein said digital-to-analog converter (DAC) is coupled to thermometer decoder wherein said thermometer decoder is electrically coupled to said up/down counter and clock signals and is configured to provide an ldacp signal.

11. The circuit of claim 2, wherein said digital filter is a sinc**2 filter.

12. The circuit of claim 2, wherein said digital filter further comprises a plurality of summers, a plurality of counters, and a 1/M divider.

13. The circuit of claim 1, wherein said integrator circuit comprises a differential amplifier circuit, a first RC integration circuit comprising a first resistor R and first capacitor C, and a second RC integration circuit comprising a second resistor R and second capacitor C, whose capacitor is coupled to the outputs of a differential amplifier circuit and whose inputs are coupled to said sampling switch network.

14. The circuit of claim 13, wherein said comparator is configured to receive a first signal and a second signal from differential integrator circuit.

15. The circuit of claim 1, further comprising a capacitor coupled to said inductor, and said output signal vout.

16. The circuit of claim 1, wherein said switching regulator is a buck converter.

17. The circuit of claim 1, wherein said switching regulator is a boost converter.

18. The circuit of claim 1, wherein the integrator circuit is only ON when the first transistor is ON and wherein the integrator circuit integrates an error between an voltage across the first transistor and an estimated value of said voltage across the first transistor.

19. A method of providing an improved current monitor in a switching regulator comprising the steps of:
   (a) providing a circuit comprising an output stage, a sense circuit, a sampling switch circuit, wherein said sampling switch circuit is configured to provide a first and second signal to an integrator circuit, said integrator circuit, a comparator, a DAC, and a feedback loop
   (b) initiating a NMOS signal to said NMOS of said output stage;
   (c) sensing a signal to a sense NMOS circuit providing a first and second, sense signals;
   (d) receiving said first and second sense signals to said sampling switch circuit;
   (e) integrating said first and second sense signals to said integration circuit;
   (f) comparing said integrated signal with said comparator signal;
   (g) processing said comparator signal;
   (h) feeding a feedback signal to said DAC; and
   (i) estimating the average output current.

20. The method of claim 19, further comprising a control logic circuit, further compris an up/down counter electrically coupled to the comparator output and clock signals, and a DAC control logic inverter coupled to said comparator output.

21. The method of claim 20 wherein said DAC is coupled to said DAC control logic inverter and is configured to provide an Idacn signal.

22. The method of claim 19, further comprising a digital filter wherein said digital filter is a sinc**2 filter.

* * * * *